United States Patent [19]

Fukui et al.

[11] 4,027,274

[45] May 31, 1977

[54] PHASE LOCKED LOOP CIRCUIT

[75] Inventors: Kiyotake Fukui, Settsu; Hiroshi Matsushima, Neyagawa; Yukinobu Ishigaki, Yamato, all of Japan

[73] Assignees: Matsushita Electric Industrial Co., Ltd., Kadoma; Victor Company of Japan, Limited, Yokohama, both of Japan

[22] Filed: June 23, 1975

[21] Appl. No.: 589,546

[30] Foreign Application Priority Data

June 25, 1974 Japan .............................. 49-72541

[52] U.S. Cl. .............................. 332/19; 331/1 A; 331/17
[51] Int. Cl.² .......................................... H03C 3/06
[58] Field of Search .................. 331/1 A, 4, 11, 17; 332/19

[56] References Cited

UNITED STATES PATENTS

| | | | |
|---|---|---|---|
| 3,411,103 | 11/1968 | Deman et al. | 331/17 |
| 3,587,003 | 6/1971 | Chastagnier | 332/19 |
| 3,882,412 | 5/1975 | Apple, Jr. | 331/1 A |

*Primary Examiner*—John Kominski

[57] ABSTRACT

A phase locked loop circuit comprises a phase comparator having an operation range with specific limits for phase comparing. A voltage-controlled oscillator produces an output at the output of the phase locked loop. At the same time, the oscillator output is fed to the phase comparator. A detector circuit, supplied with the output of the phase comparator, detects any exceeding of a specific limit of the phase by comparing the operation range of the phase comparator with a phase deviation of the oscillator output signal fed to the phase comparator. The detector produces an output correction voltage. An adder circuit adds this output correction voltage and an output error voltage of the phase comparator and supplies the resulting added voltage, as a control voltage, to the voltage-controlled oscillator. This phase locked loop operates in a state wherein the lock range thereof has been equivalently expanded by the correction voltage.

2 Claims, 8 Drawing Figures

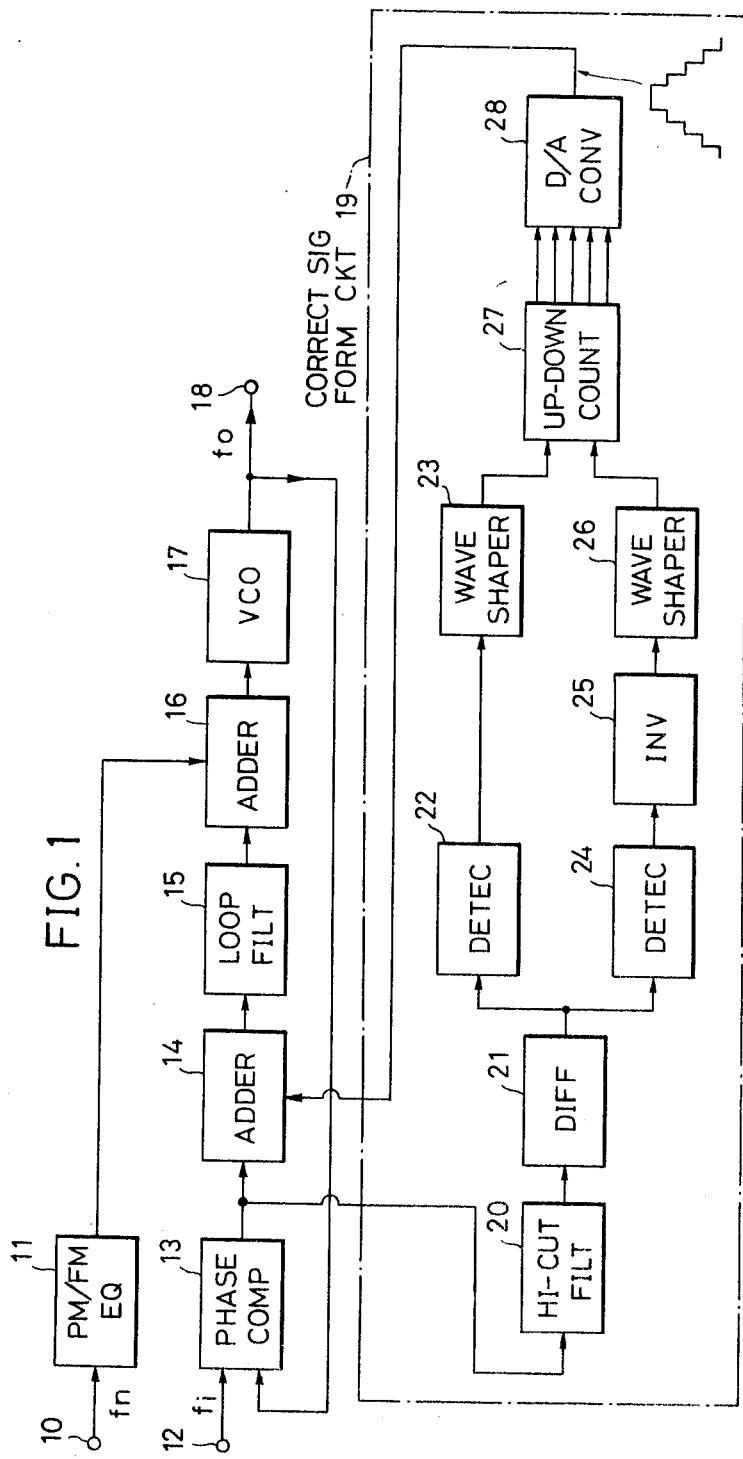

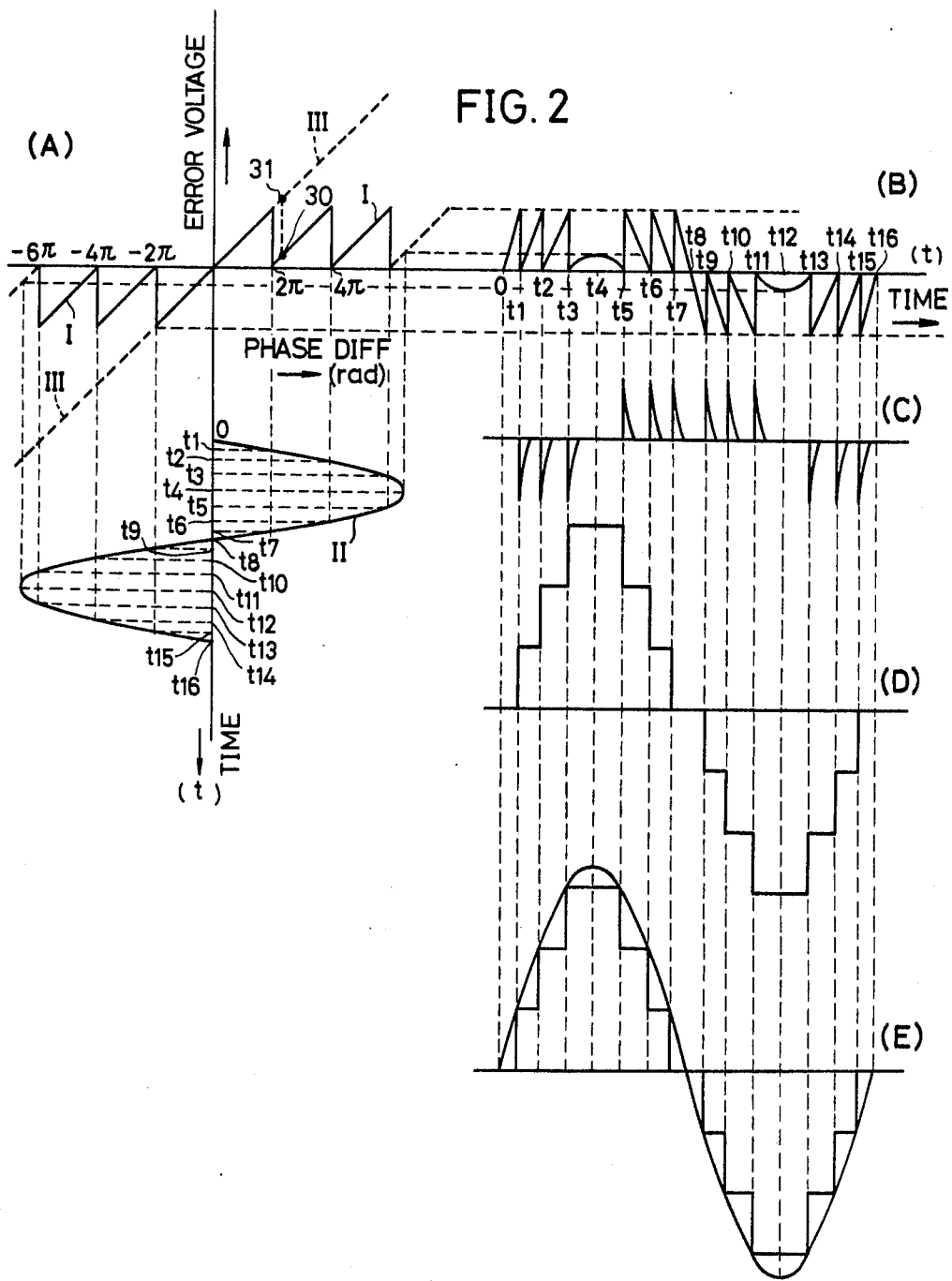

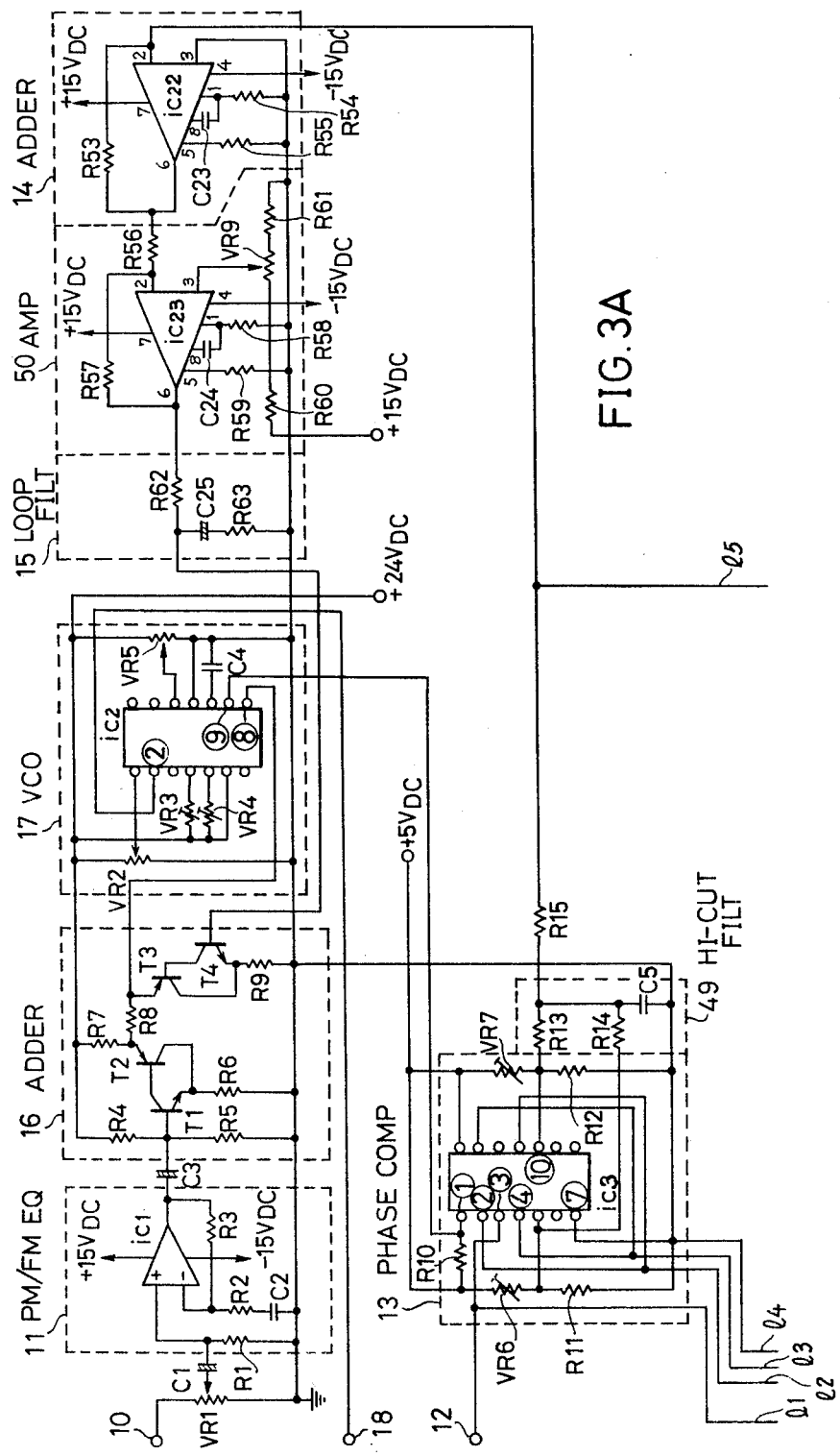

4,027,274

PHASE LOCKED LOOP CIRCUIT

BACKGROUND OF THE INVENTION

The present invention relates generally to phase locked loop circuits, and more particularly to a phase locked loop circuit having a control circuit for operating the phase locked loop with a substantially broadened lock range.

In general, a conventional phase locked loop (hereinafter referred to as PLL) comprises a phase comparator, a low-pass filter, and a voltage-controlled oscillator (hereinafter referred to as a VCO). In the operation of this circuit, an input signal $f_i$ of a phase angle of $\theta_i$ is applied to the phase comparator. There it is phase compared with an output from the VCO, to produce an error voltage in accordance with the resulting phase difference. The high-frequency component of this error voltage is removed by the low-pass filter. The remaining signal is supplied to the VCO where it controls the oscillation frequency thereof. The resulting output of the VCO is supplied, on the hand, as a PLL output signal $f_o$ of a phase angle $\theta_o$ to the succeeding stage and, on the other hand, is fed back to the back to the above mentioned phase comparator.

Here, the lock range $\omega_L$ of the PLL can be expressed as follows in terms of $K_d$, the conversion gain of the phase comparator and $F_{(s)}$, the transfer function of the low-pass filter. The conversion gain of the VCO is expressed by $K_o/s$, and the DC gain of the low-pass filter is made equal to unity (1).

$$\omega_L = K_d \cdot K_o \cdot (\theta_i - \theta_o)$$

Therefore, when the natural angular frequency $\omega_n$ and the damping factor $\zeta$ of the PLL are constant, the lock range is influenced by the output of the phase comparator.

Heretofore, however, the operational range of the phase detection of the phase comparator of the PLL was from $-\pi/2$ rad. to $+\pi/2$ rad. in a phase comparator using a multiplier. It was from $-\pi$ rad. to $+\pi$ rad. or from $-2\pi$ rad. to $+2\pi$ rad. in a digital phase comparator, as is known. The range of the phase detecting operation range has been relatively narrow in either of these phase comparators.

Consequently, a conventional PLL has a narrow lock range. For this reason, it is easily affected by external disturbing noises imparted to the circuit. Unlocking readily occurs, with respect to frequency fluctuation, due to temperature variation and to variations of the VCO with elapse of time.

SUMMARY OF THE INVENTION

Accordingly, it is a general object of the present invention to provide a novel and useful phase locked loop circuit in which the above described problems have been solved.

Another and more specific object of the invention is to provide a phase locked loop circuit in which, any unlocking in the lock range of the phase locked loop is detected. The detection of the operational range of phase comparison by the phase comparator is, in actuality, substantially broadened to widen the above mentioned lock range. By this provision of the phase locked loop circuit of the invention, the effect of disturbing noise can be reduced. The temperature characteristics of the voltage controlled oscillator and characteristic change with elapse of the time can be stablized. Furthermore, the PLL lock-in adjustment is facilitated with respect to the voltage controlled oscillator.

Still another object of the invention is to provide a phase locked loop circuit for angle modulating in a frequency range, which is higher than the lock frequency of the loop. By this provision of the invention, it is possible to obtain an ample dynamic range of the angle-modulated wave signal.

Other objects and further features of the invention will be apparent from the following detailed description when read in conjunction with the accompanying drawings.

BRIEF DESCRIPTION OF THE DRAWINGS

In the drawings:
FIG. 1 is a block schematic diagram showing one embodiment of a phase locked loop circuit according to the present invention;
FIGS. 2(A) through 2(E) are graphical representations respectively indicating signal waveforms for a description of the operation of the block diagram shown in FIG. 1; and
FIGS. 3A and 3B are respectively schematic diagrams showing one embodiment of a specific circuit of the phase locked loop circuit according to the invention.

DETAILED DESCRIPTION

Figure 3B:
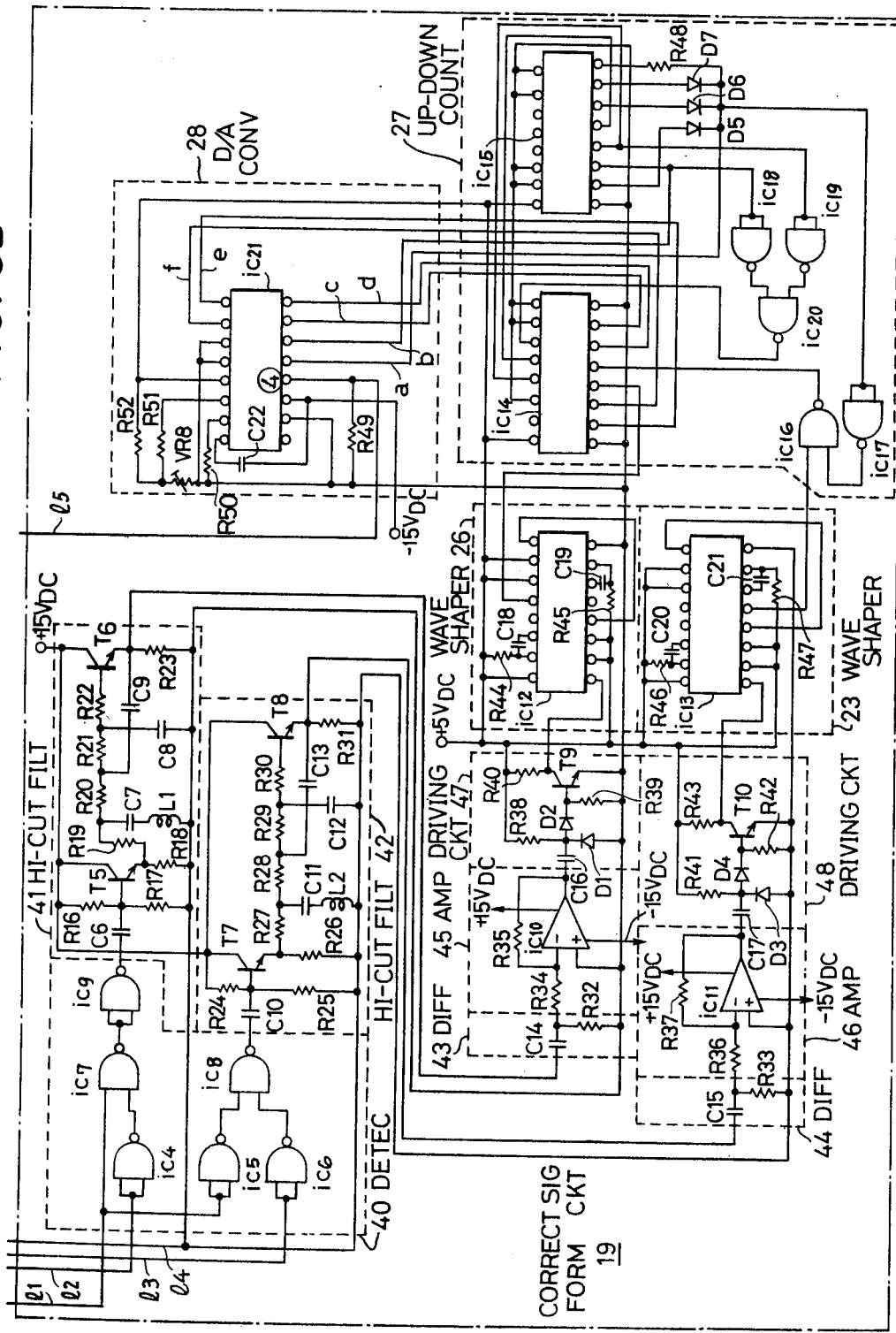

In FIG. 1, the one embodiment of a phase locked loop circuit of the invention is shown in block diagram. Its description below illustrates a case where it is used as an angle modulator in the recording system for a multichannel record disc.

A signal $f_n$, representing the difference between the signals of two channels, is introduced through an input terminal 10 in the PLL illustrated in FIG. 1. Signal $f_n$ acquires a specific characteristic imparted by a PM/FM equalizer 11, and then it is supplied to an adder 16.

On the other hand, a carrier wave reference signal, $f_i$ (of, for example, 30 KHz) is introduced which has been introduced through an input terminal 12 and applied to one input of a phase comparator 13. There it is compared with an output from a voltage controlled oscillator (VCO) 17, described hereinafter. The phase comparator 13 thus produces an output error signal which is supplied to an adder 14 and to a high-cut filter 20, of a correction signal forming circuit 19, described hereinafter.

The output signal of the phase comparator 13 is supplied to the adder 14 and added to the output signal of a digital-to-analog (D/A) converter 28, described hereinafter. The resulting output sum signal is passed through a loop filter (low-pass filter) 15 and fed to the above mentioned adder 16. There it is added to the difference signal from the above mentioned PM/FM equalizer 11. The resulting output signal of the adder 16 is fed, as a control signal, to the VCO 17 to control the oscillation frequency thereof. The output of the VCO 17 is applied to the above mentioned phase comparator 13, as another input thereof. At the same time, it is led out through an output terminal 18 as a signal which is angle-modulated on the above mentioned carrier wave. The modulating signal is the above mentioned difference signal.

FIG. 2(A), line I, is one example of a phase comparison error voltage representing the relationship of the phase difference between the carrier wave signal and the output of the VCO. The carrier wave is introduced through the input terminal 12 to the phase comparator 13. In this figure, if the operation range of the phase comparison detection of the phase comparator 13 is, for example, from $-2\pi$ rad. to $+2\pi$ rad. in terms of phase difference, and the phase difference of the above mentioned two signals is between $-2\pi$ rad. and $+2\pi$ rad., the output error voltage is linear with respect to the phase difference. The phase locked loop (PLL) comprising the phase comparator 13, the low-pass filter 15, and the VCO 17 is in its locked state.

However, when a signal of high level is applied from the input terminal 10, through the PM/FM equalizer 11 and adder 16, and to the VCO 17, the output oscillation frequency of the VCO 17 becomes high. As indicated by the curve II in FIG. 2(A), the phase deviation of the output signal of the VCO 17 exceeds the limit of $\pm 2\pi$ rad. of the above mentioned phase comparing operation range, and the PLL becomes unlocked. More specifically, if the signal indicated by curve II in FIG. 2(A) is imparted to the VCO 17, the output phase comparison error voltage of the phase comparator 13 becomes as indicated in FIG. 2(B). The phase difference becomes 2 rad. at a time $t1$, and the locked state is terminated. Similarly, at times $t2$, $t3$, $t5$, $t6$, $t7$, $t9$, $t10$, $t11$, $t13$, $t14$, $t15$ . . ., the phase difference becomes $\pm 2\pi \cdot n$ rad. (wherein $n$ is an integer), and unlocking of the PLL occurs. As a result, an output error voltage is obtained from the phase comparator 13 with a waveform, as indicated in FIG. 2(B).

As indicated in FIG. 2(B), this output signal of the phase comparator 13 is supplied to the high-cut filter 20 having a low-pass filter characteristic with a cut-off frequency of approximately 12 to 14 KHz. There, the carrier wave component is removed therefrom. The signal which has thus passed through the high-cut filter 20 is fed to a differentiation circuit 21, where it is differentiated to form negative and positive polarity pulses, as indicated in FIG. 2(C). Since the input signal has an AC characteristic, differentiated pulses, of negative and positive polarities, are always obtained.

These output differentiated pulses from the differentiation circuit 21 are supplied to detectors 22 and 24. There, the pulses of positive polarity and negative polarity are respectively detected. The output pulses, of positive polarity, from the detector 22 are shaped into a rectangular waveform by a wave shaper circuit 23. Then, they are supplied to cause an up-down counter 27 to count in the "up" direction. On the other hand, the output pulses, of negative polarity, from the detector 24 are phase inverted in an inverted 25, shaped into a rectangular waveform by a wave shaper circuit 26, and then supplied to cause the up-down counter 27 to count in the "down" direction. That is, the up-down counter 27 is adapted to carry out an addition operation each time that a pulse arrives from the wave shaper circuit 23, for example, and a subtraction operation each time that a pulse arrives from the wave shaper circuit 26.

The resulting output of the up-down counter 27 is supplied to the aforementioned digital-to-analog (D/A) converter 28, where it is converted into an analog correction signal, of stepped waveform, as indicated in FIG. 2(D). This correction signal is fed to the aforementioned adder 14, where it is added to the phase comparison error voltage signal, as indicated in FIG. 2(B), appearing at the output of the phase comparator 13. Here, the absolute value of the voltage of each step of the stepped wave indicated in FIG. 2(D) is substantially equal to the absolute value of the output voltage, for example, in the phase difference at the $2\pi$ level in FIG. 2(A). Therefore, the waveform of the output signal of the adder 14 becomes as indicated in FIG. 2(E).

Consequently, in passing through the adder 14, the output voltage of the phase comparator 13 is formed into a signal substantially as indicated in FIG. 2(E). After further passing through loop filter 15 and adder 16, it is supplied to the VCO 17, to control the oscillation frequency thereof.

Here, the output of the phase comparator 13 is a stepped waveform signal substantially as indicated in FIG. 2(E). The output voltage of the phase comparator 13, during the interval between times $t1$ and $t2$, for example, is a voltage as indicated at point 30 in FIG. 2(A) in conventional circuits. Whereas, according to the present invention, it is a voltage as indicated at point 31. Accordingly, the linear range (phase comparing operation range) of the output error voltage expands, with respect to the phase difference of the input signal of the phase comparator 13 exceeding $\pm 2\pi$ rad. Equivalently, it acquires a linearity over a broad range, exceeding $\pm 2\pi$ rad. as indicated by the intermittent line III in FIG. 2(A). Accordingly, the lock range of the PLL expands, as a result.

In this connection, if the input signal has a waveform as indicated by curve II in FIG. 2(A) and is a signal of a level below that corresponding to the phase difference $\pm 2\pi$ rad., the correction signal forming circuit 19 does not operate. The output error voltage of the phase comparator 13 is supplied directly, as it is, by way of the loop filter 15 and the adder 16 to the VCO 17. The PLL thus operates in the same manner as in the conventional case.

In the embodiment of FIG. 1, the PLL of the invention is used as a difference signal angle modulator in a discrete multichannel record recording system. The angle-modulated wave difference signals and direct wave sum signals are multiplexed and recorded. However, the phase locked loop system of the present invention is not limited to this application. It can, of course, be used for other applications such as an ordinary angle modulator and a demodulator for angle modulated waves.

Furthermore, a multiplier can be used in place of the phase comparator 13 in the above described embodiment. Also a shift register can be used instead of the up-down counter 27. In addition, an integrator circuit may be used instead of the D/A converter 28.

Next to be described is one embodiment of a specific phase locked loop circuit of the invention in conjunction with FIGS. 3A and 3B. The circuit sections corresponding to the blocks in FIG. 1 are enclosed by intermittent lines and are respectively designated by the same reference numerals, as in FIG. 1.

In FIG. 3A, a difference signal $f_n$ is applied to the input terminal 10, at a specific level set by a variable resistor VR1. It is then supplied by way of a coupling capacitor C1 to the PM/FM equalizer 11 comprising resistors R1, R2, and R3, a capacitor C2, and an integrated circuit $ic1$. If the circuit is being used merely for frequency modulation, the equalizer 11 is not used. The signal which has passed through the equalizer 11 is supplied by way of a coupling capacitor C3 to the adder 16, comprising resistors R4 through R9, and transistors T1 through T4. Then, the signal is mixed at the emitter of the transistor T3, with the output error signal from the loop filter 15.

The resulting output signal of the adder 16 is supplied to the eighth pin of an integrated circuit ic2 of the VCO 17 comprising variable resistors VR2 through VR5, a capacitor C4, and the integrated circuit ic2. An output modulated wave signal, of a sinusoidal waveform, is obtained from the second pin of the integrated circuit ic2 of the VCO 17, and is led out through the output terminal 18. Furthermore, an output modulated wave signal $f_o$ of square wave form obtained from is the ninth pin of the integrated circuit ic2, and is supplied to the first pin of an integrated circuit ic3 of the phase comparator 13, comprising variable resistors VR6 and VR7, resistors R10, R11, and R12, and the integrated circuit ic3.

The reference carrier wave $f_i$ is supplied through the input terminal 12 to the phase comparator 13, at the third pin of its integrated circuit ic3. The phase of this reference carrier wave $f_i$ is compared with the output signal $f_o$ of the VCO 17. This phase comparator 13 has a specific phase comparing operation range of $-2\pi$ rad. to $+2\pi$ rad.

An output signal from the 10th pin of the integrated circuit ic3 of this phase comparator 13 is sent through a high-cut filter 49 comprising resistors R13 and R14 and a capacitor C5. There its carrier wave component is removed, and is then supplied to the adder 14. Output signals from the second, fourth, and seventh pins of the integrated circuit ic3 are respectively supplied to, through lines $l2$, $l3$, and $l4$, to integrated circuits ic4, ic5, and ic6 of the correction signal forming circuit 19 shown in FIG. 3B. The PLL is unlacked when the level of the input signal $f_n$ introduced through the input terminal 10 increases, and the phase deviation of the modulated wave signal $f_o$ produced as output from the VCO 17 exceeds $\pm 2\pi$ rad. at the terminals of the capacitor C5 for high-cut filtering, an error signal of a waveform is obtained, as indicated in FIG. 2(B).

Integrated circuits ic4 through ic9 discriminately detect the rising periods of signals (times O through $t4$, $t12$ through $t16$ . . . and the falling periods (times $t4$ through $t12$). It is to be noted that the operation of the detector circuit section 40 comprising these integrated circuits ic4 through ic9 corresponds to the operation of the circuit section of the detectors 22 and 24 and the inverter 25, in the block diagram shown in FIG. 1.

A downward error signal, obtained from the integrated circuit ic9, is sent through a high-cut filter 41 comprising resistors R16 through R23, capacitors C6 through C9, a coil L1, and transistors T5 and T6. There the carrier wave component is removed. Then, it is differentiated by a differentiation circuit 43 comprising a capacitor C14 and a resistor R23. The phase of the resulting differentiated pulses are inverted and amplified with a high-gain by a phase-inversion amplifier circuit 45, comprising resistors R34 and R35 and an amplifier ic10, in the form of an integrated circuit. These pulses are then fed to a driving circuit 47 comprising resistors R38, R39, and R40, a capacitor C16, diodes D1 and D2, and a transistor T9. The resulting output of differentiated pulses are supplied from this driving circuit 47 to drive the wave shaper circuit 26 of a monostable multivibrator comprising resistors R44 and R45, capacitors C18 and C19, and an integrated circuit ic12.

On the other hand, an upward error signal is sent from the integrated circuit ic8 through a high-cut filter 42 comprising resistors R24 through R31, capacitors C10 through C13, a coil L2, and transistors T7 and T8. There, the carrier wave component is removed. Then, it is differentiated by a differentiation circuit 44 comprising a capacitor C15 and a resistor R33. The phase of the resulting differentiated pulses are inverted and amplified with high-gain by a phase-inversion amplifier circuit 46, comprising resistors R36 and R37 and an amplifier ic11 in the form of an integrated circuit. The pulses are thereafter fed to a driving circuit 48 comprising resistors R41, R42, and R43, a capacitor C17, diodes D3 and D4, and a transistor T10. The resulting differentiated output pulses are fed from the driving circuit 48 to the wave shaper circuit 23 of a monostable multivibrator, comprising resistors R46 and R47, capacitors C20 and C21, and an integrated circuit ic13.

The resulting shaped output pulse voltages of the wave shaper circuits 26 and 23 are supplied to the up-down counter 27 comprising a resistor R48, diodes D5, D6, and D7, and integrated circuits ic14 through ic20. The resulting output of the up-down counter 27 is supplied to the D/A converter 28 comprising resistors R49 through R52, a variable resistor VR8, a capacitor C22, and an integrated circuit ic21. The resulting correction signal of the step-shaped output waveform voltage (FIG. 2(D)) of the D/A converter 28 is supplied to the adder 14 comprising a resistor R15, a parallel connected combined resistance of the output resistance of the fourth pin of the integrated circuit ic21 and the resistance value of the resistor R49, resistors R53, R54, and R55, a capacitor C23, and an integrated circuit ic22 (FIG. 3A). There it is added to the output of the phase comparator 13 which has passed through a high-cut filter 49.

The signal from the adder 14, of the waveform indicated in FIG. 2(E), passes through an error signal amplifier circuit 50 comprising resistors R56 through R61, a variable resistor VR9, a capacitor C24, and an integrated circuit ic23. Then, the signal passes through the loop filter 15 comprising resistors R62 and R63 and a capacitor C25. At the same time, the tracking angular frequency $\omega_n$ of the loop is set. Thereafter, this signal is applied to the base of the transistor T4 of adder 16. The output of the adder 16 is fed to the VCO 17. It is to be noted that the resistors R60 and R61 and the variable resistor VR9 of the amplifier circuit 50 function additionally as a DC bias circuit, with respect to the VCO 17.

If the phase deviation does not reach $\pm 2\pi$ rad. in the phase comparator 13, the correction signal forming circuit 19 does not operate. Only the output of the phase comparator 13, which has passed through the high-cut filter 49, is supplied to the adder 14.

The expansion of the lock range of the phase locked loop can be effected, equivalently, by the correction signal forming circuit 19. Here, this lock range can be broadened by further increasing the number of the coupled circuit of the up-down counter 27 and the D/A converter 28. More specifically, when the limits of the range of phase comparison of the phase comparator 13 are set at $\pm 2\pi$ rad., and the number of the coupled circuit of the up-down counter 27 and the D/A converter 28 is denoted by $n$, the limits of the equivalently expanded range of phase comparison operation are expressed by $\pm (2\pi + 2^n\pi)$ rad.

In the embodiment illustrated in FIG. 3B, five of the circuits coupled by six lines $a$ through $f$, are actually used. The limits of the phase comparison operation range (i.e., phase deviation limits) in a conventional phase locked loop, wherein a lock range correction circuit 19 is not provided, was ± 2π rad., or approximately 6.28 rad.. These limits are broadened in the instant embodiment to values as much as ± (2π + $2^5\pi$)rad., that is, ± 34π rad., or approximately 106.8 rad.

Further, this invention is not limited to these embodiments, but variations and modifications may be made without departing from the scope and spirit of the invention.

What we claim is:

1. A phase locked loop circuit comprising:
two input phase comparator means having an operation range with specific limits of phase comparison, one of said inputs being supplied with a carrier wave;
voltage-controlled oscillator means for generating output frequencies which are controlled responsive to a control signal, said output frequencies being supplied to the other input of the phase comparator;
differentiation means responsive to the output of the phase comparator means for producing differentiated output pulses of positive or negative polarities each time that the phase deviation of the output of the voltage-controlled oscillator means exceeds the limits of the operation range of the phase comparator means;
detecting means for discriminating between the polarities of the differentiated pulses;
up-down counter means for counting in either an upward direction or a downward direction responsive to the discriminated polarities of the differentiated pulses;
digital-to-analog converter means for converting the resulting output of the up-down counter into a step-shaped correction signal voltage waveform;
first means for adding said correction signal and an output of the phase comparator to produce an output error signal;
loop filter means for eliminating predetermined frequencies from the output of said first adding means, said predetermined frequencies being higher than a minimum frequency of a modulation signal; and
second means for adding the output error signal and an input modulation signal, the output of said second adding means being supplied as said control signal to the voltage-controlled oscillator;
said output frequencies of the voltage-controlled oscillator being an angle-modulated carrier wave produced responsive to said input modulation signal.

2. A phase locked loop circuit comprising:
two input phase comparator means having an operation range with specific limits of phase comparison, one of said input terminals being supplied with a carrier wave;
voltage-controlled oscillator means for generating output frequencies which are controlled responsive to a control signal, said output frequencies being supplied to the other input of the phase comparator;
detecting means for discriminating between the output polarities of the phase comparator means;
differentiation means responsive to the resulting output of the detecting means for producing differentiated output pulses of positive or negative polarity;
up-down counter means for counting in either the upward or downward directions in accordance with the polarities of said differentiated output pulses;
digital-to-analog converter means for converting the resulting output of the up-down counter into a step-shaped output correction signal voltage waveform;
first means for adding said correction signal and an output signal of the phase comparator to produce an output error signal;
loop filter means for eliminating predetermined frequency components from the output of said first adding means, said frequency components being higher than a minimum frequency of the modulation signal; and
second means for adding the output error signal and an input modulation signal, the output of said second adding means being supplied as said control signal to the voltage-controlled oscillator;
said output frequencies of the voltage-controlled oscillator being an angle-modulated carrier wave produced responsive to said input modulation signal.

* * * * *